United States Patent
Yu et al.

(10) Patent No.: US 8,580,614 B2
(45) Date of Patent: Nov. 12, 2013

(54) EMBEDDED WAFER-LEVEL BONDING APPROACHES

(71) Applicant: Taiwan Semiconductor Manufacturing Company, Ltd., Hsin-Chu (TW)

(72) Inventors: Chen-Hua Yu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/734,651

(22) Filed: Jan. 4, 2013

(65) Prior Publication Data
US 2013/0122655 A1     May 16, 2013

Related U.S. Application Data

(62) Division of application No. 12/880,736, filed on Sep. 13, 2010, now Pat. No. 8,361,842.

(60) Provisional application No. 61/369,366, filed on Jul. 30, 2010.

(51) Int. Cl.
*H01L 21/50* (2006.01)

(52) U.S. Cl.
USPC ............ 438/110; 257/678; 257/E21.499; 257/E21.503; 438/118; 438/126; 438/127

(58) Field of Classification Search
USPC .......... 257/678, E21.499, E21.502, E21.503; 438/110, 118, 126, 127
See application file for complete search history.

(56) References Cited

U.S. PATENT DOCUMENTS

| | | | |
|---|---|---|---|
| 7,276,783 B2 | 10/2007 | Goller et al. | |
| 2006/0068332 A1* | 3/2006 | Chen | 430/312 |
| 2007/0126127 A1 | 6/2007 | Jobetto et al. | |
| 2008/0029895 A1* | 2/2008 | Hu et al. | 257/762 |

FOREIGN PATENT DOCUMENTS

TW    533559 B    5/2003

OTHER PUBLICATIONS

Keser, B. et al., "The Redistributed Chip Package: A Breakthrough for Advanced Packaging," 2007 Electronic Components and Technology Conference, IEEE, pp. 286-291.

Yoon, S. W. et al., "3D eWLB (embedded wafer level BGA) Technology for 3D-Packaging/3D-SiP (Systems-in-Package) Applications," 2009 11$^{th}$ Electronics Packaging Technology Conference, IEEE, pp. 915-919.

* cited by examiner

*Primary Examiner* — Peniel M Gumedzoe
(74) *Attorney, Agent, or Firm* — Slater & Matsil, L.L.P.

(57) ABSTRACT

A method includes providing a carrier with an adhesive layer disposed thereon; and providing a die including a first surface, a second surface opposite the first surface. The die further includes a plurality of bond pads adjacent the second surface; and a dielectric layer over the plurality of bond pads. The method further includes placing the die on the adhesive layer with the first surface facing toward the adhesive layer and dielectric layer facing away from the adhesive layer; forming a molding compound to cover the die, wherein the molding compound surrounds the die; removing a portion of the molding compound directly over the die to expose the dielectric layer; and forming a redistribution line above the molding compound and electrically coupled to one of the plurality of bond pads through the dielectric layer.

16 Claims, 7 Drawing Sheets

EMBEDDED WAFER-LEVEL BONDING APPROACHES

This application is a divisional of U.S. patent application Ser. No. 12/880,736, filed Sep. 13, 2010, and entitled "Embedded Wafer-Level Bonding Approaches," which application further claims the benefit of U.S. provisional application No. 61/369,366, filed Jul. 30, 2010, and entitled "Embedded Wafer-Level Bonding Approaches," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly with time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 7A are cross-sectional views of intermediate stages in the manufacturing of an embedded wafer-level package in accordance with various embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel embedded wafer-level package structure and methods of forming the same are provided in accordance with an embodiment. The intermediate stages of manufacturing the embodiment are illustrated. Variations of the embodiment are also discussed. Throughout the various views and illustrative embodiments, like reference numbers are used to designate like elements.

Figure 1:
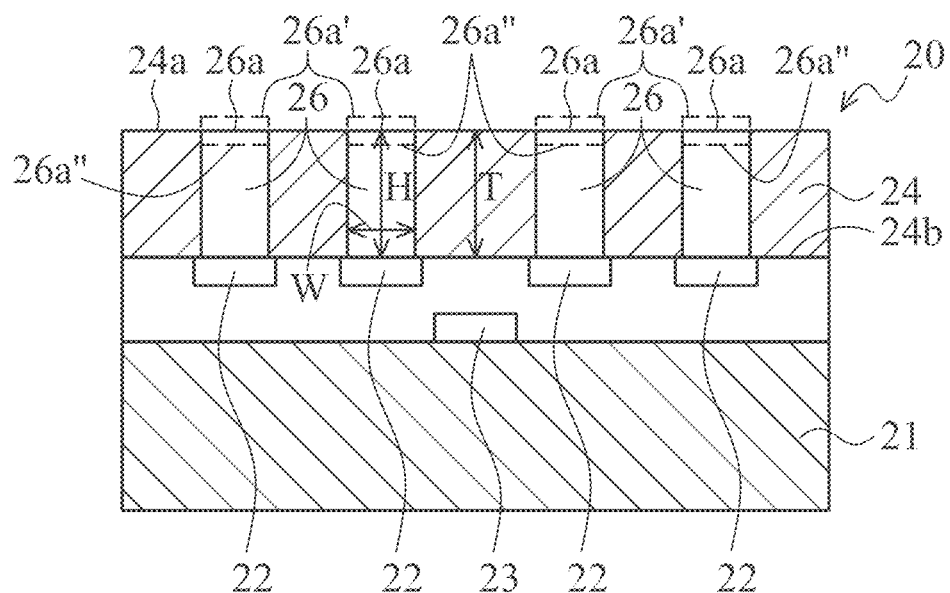

Referring to FIG. 1, die 20, which is one of a plurality of identical dies 20 (refer to FIG. 2), is provided. Die 20 may include semiconductor substrate 21, and may include integrated circuit devices 23 and overlying interconnect structures (not shown) formed therein. Integrated circuit devices 23 may include active devices such as transistors. Bond pads 22 are formed in dies 20, and are electrically coupled to the integrated circuit devices 23 through the interconnect structures. Bond pads 22 may be formed of aluminum, copper, nickel, or combinations thereof. Dielectric layer 24 is formed over bond pads 22. In an embodiment, the top surfaces of bond pads 22 are substantially level with the bottom surface 24b of dielectric layer 24. Dielectric layer 24 is a thick layer with thickness T greater than about 10 μm, and may be between about 10 μm and 30 μm, or between about 10 μm and about 50 μm. The material of dielectric layer 24 may be selected from solder resists, polybenzoxazole (PBO), benzocyclobutene (BCB), molding compounds, and the like. Edges of dielectric layer 24 are vertically aligned to respective edges of substrate 21.

Metal pillars 26 are formed in dielectric layer 24, and are electrically coupled to bond pads 22. In an embodiment, metal pillars 26 have bottom surfaces contacting the top surfaces of bond pads 22. Metal pillars 26 may comprise copper, and hence are alternatively referred to as copper pillars 26 throughout the description. However, other conductive materials such as nickel and/or aluminum may also be used in copper pillars 26. Height H of copper pillars 26 may also be greater than about 10 μm, and may be between about 5 μm and 30 μm, or between about 10 μm and about 50 μm. The lateral size W, which may be a length/width or a diameter (depending on the top-view shape of copper pillars 26), may be less than about 60 μm. Accordingly, the ratio of H/W may be greater than about 0.15. In an embodiment, top surfaces 26a of copper pillars 26 are substantially level with top surface 24a of dielectric layer 24. In other embodiments, top surfaces 26a' of copper pillars 26 are higher than top surface 24a, so that portions of copper pillars 26 protrude above top surface 24a. In yet other embodiments, top surfaces 26a'' of copper pillars 26 are lower than top surface 24a, and hence copper pillars 26 are embedded in dielectric layer 24, with a thin layer of dielectric layer 24 directly over copper pillars 26.

Figure 2:
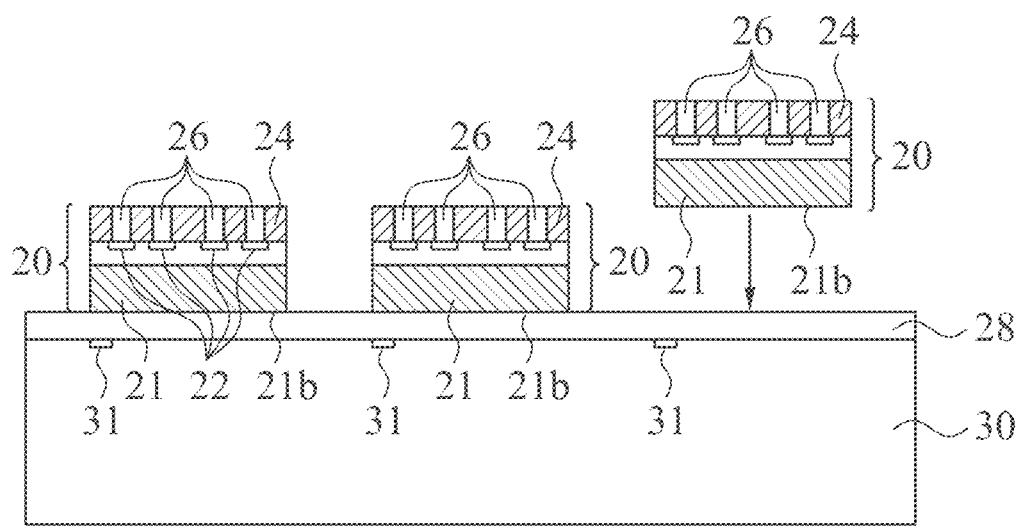

Referring to FIG. 2, adhesive layer 28 is disposed, for example, laminated, on carrier 30. Adhesive layer 28 may be formed of a glue, or may be a lamination layer formed of a foil. Dies 20 are then placed on carrier 30 through adhesive layer 28. In the embodiments wherein dies 20 include semiconductor substrates 21, the bottom surfaces 21b of semiconductor substrates 21 contact adhesive layer 28. Carrier 30 may include alignment marks 31, so that dies 20 are accurately mounted on desirable positions of carrier 30. Spaces are left between neighboring dies 20.

Figure 3:
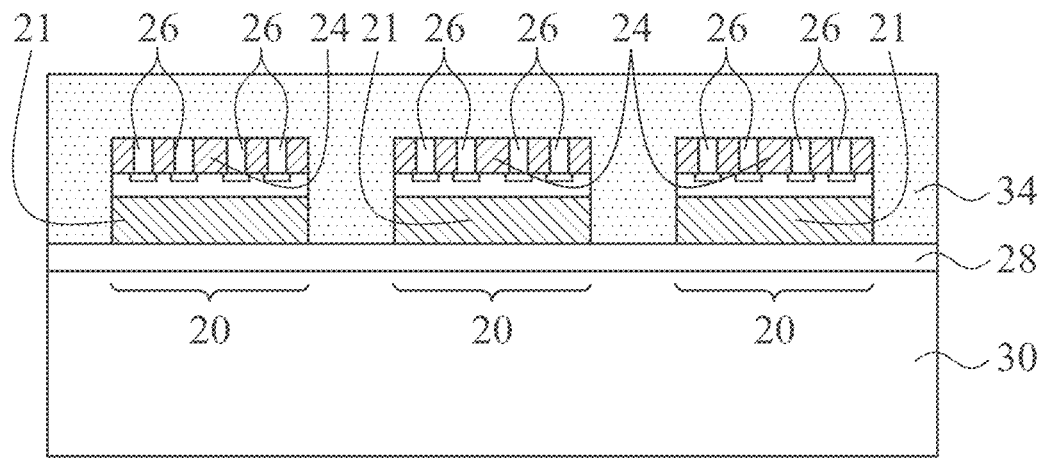

FIG. 3 illustrates the filling of molding compound 34 into the spaces between dies 20. The top surfaces of dies 20 are also covered by molding compound 34. Molding compound 34 may be an organic material such as an epoxy, which is filled into the spaces between dies 22 in a liquid form. A curing process is then performed to solidify molding compound 34.

Figure 4:
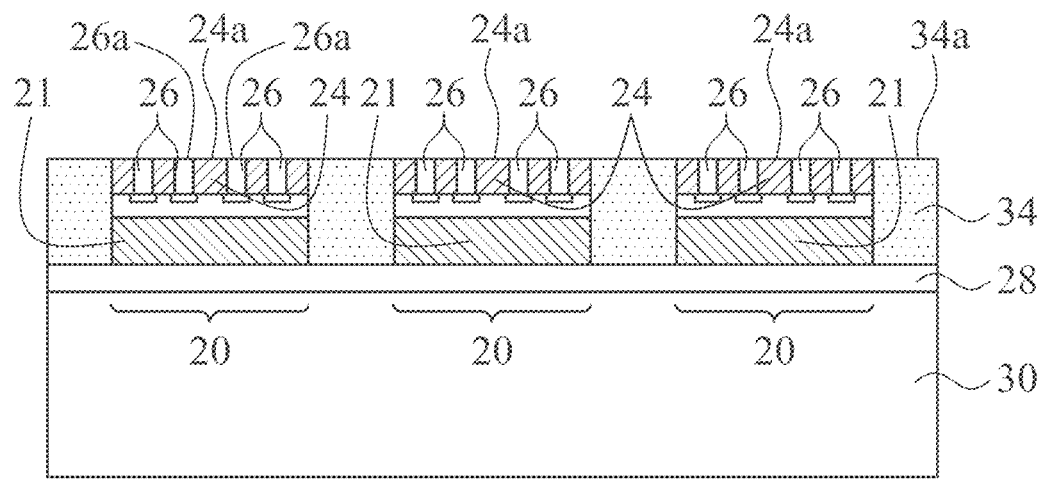

Referring to FIG. 4, a planarization such as a grinding is performed on molding compound 34, until copper pillars 26, and possibly dielectric layer 24, are exposed. Accordingly, top surface 24a of dielectric layer 24, top surfaces 26a of copper pillars 26, and top surface 34a of molding compound 34 may be substantially level with each other. In the embodiment wherein copper pillars 26 are embedded in dielectric layer 24, a layer of dielectric layer 24 is also grinded. As a result of the grinding, no molding compound 34 is directly over dies 20. When viewed from top, copper pillars 26 are surrounded by, and contacting, dielectric layer 24. Further, copper pillars 26 and dielectric layer 24 in each die 20 form an integrated component that is surrounded by molding compound 34.

Figure 5:
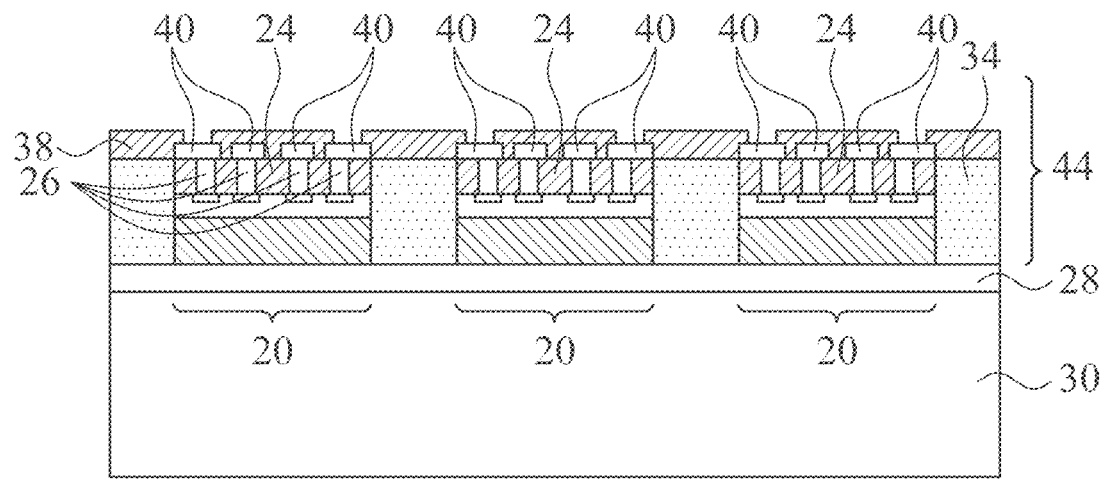

Next, as shown in FIG. 5, redistribution layer(s) (RDL) are formed, wherein the RDLs include dielectric layer(s) 38, and conductive traces 40 (including metal lines and vias, also referred to as redistribution lines) in dielectric layers 38. Conductive traces 40 may extend beyond edges of the respective dies 20 directly over molding compound 34, and hence the resulting packaging is a fan-out packaging. During the formation of conductive traces 40, copper pillars 26 may be used as alignment marks. Accordingly, the accuracy in formation of RDLs is improved. Wafer 44, which includes dies 20, molding compound 34, and the RDLs, is thus formed.

Figure 6:
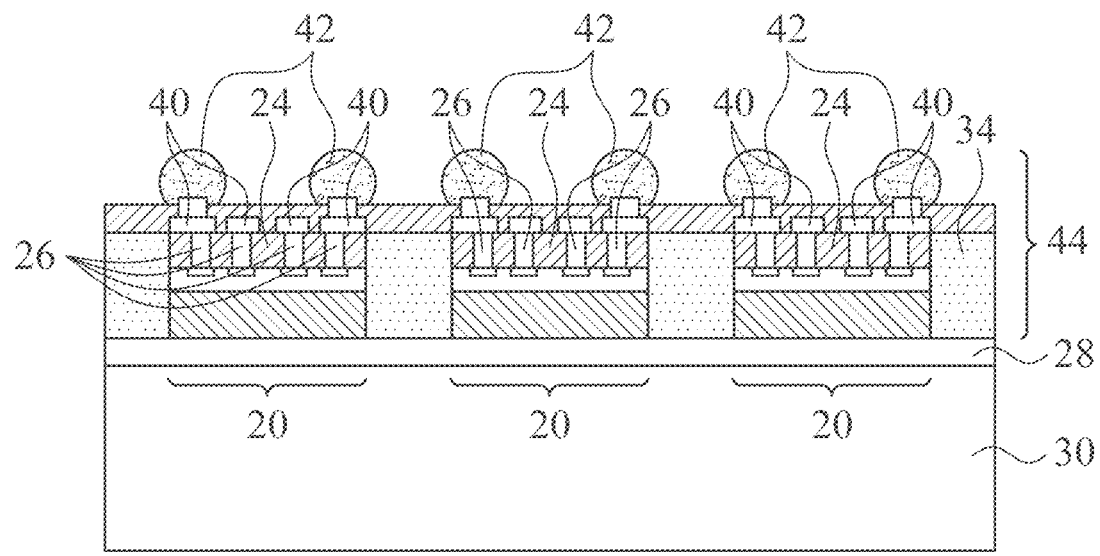

FIG. 6 illustrates the formation of metal bumps 42, which are electrically coupled to conductive traces 40. Furthermore, bond pads (not shown) may also be formed, with metal bumps 42 formed on, and physically contacting, the bond pads. As a result, metal bumps 42 are located on the top surface of the newly formed wafer 44. Metal bumps 42 may be solder balls that are transferred onto wafer 44 using a ball-mounting head. Alternatively, metal bumps 42 are non-reflowable bumps such as copper bumps. Some of metal bumps 42 may also be formed beyond directly over molding compound 34.

Figure 7A:
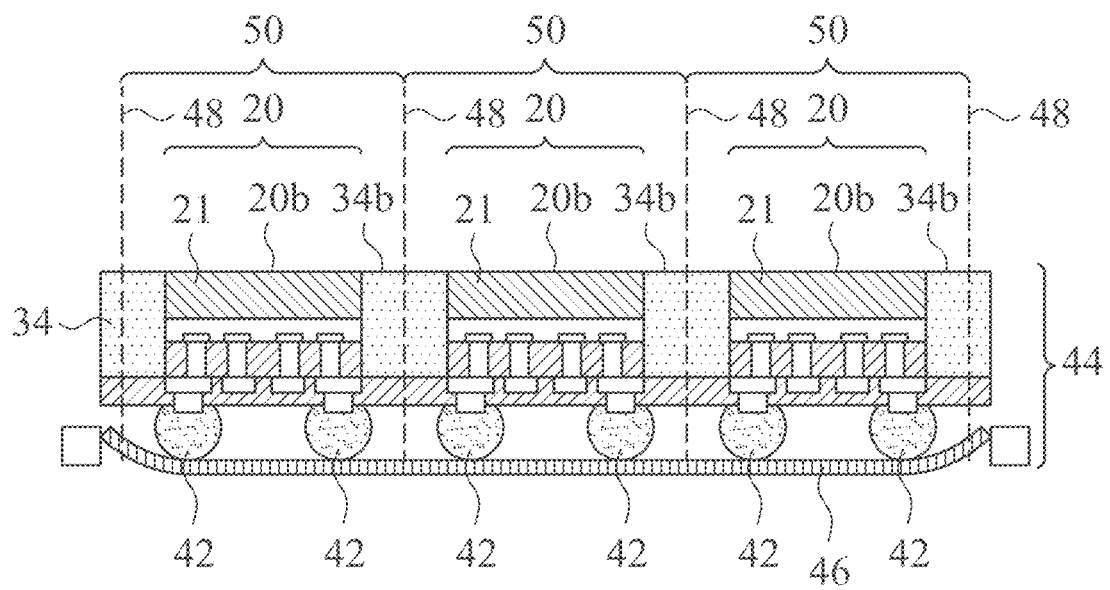
Figure 7B:
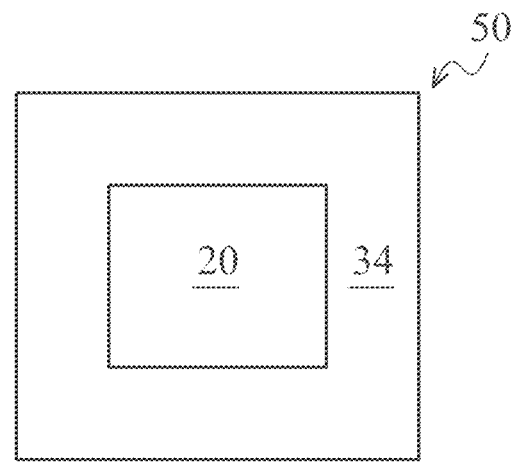
FIG. 7B illustrates a top view of a die shown in FIG. 7A.

Next, as shown in FIG. 7A, carrier 30 is demounted from wafer 44, and adhesive layer 28 is removed, leaving wafer 44. Wafer 44 may then be attached onto tape 46, and sawed apart along scribe lines 48. Accordingly, dies 50 are formed. It is appreciated that in each of dies 50, the bottom surface 20b of die 20 is level with bottom surface 34b of molding compound 34. FIG. 7B illustrates a top view of die 50, which shows that molding compound 34 encircles die 20, and contacts sidewalls of die 20.

Figure 8:
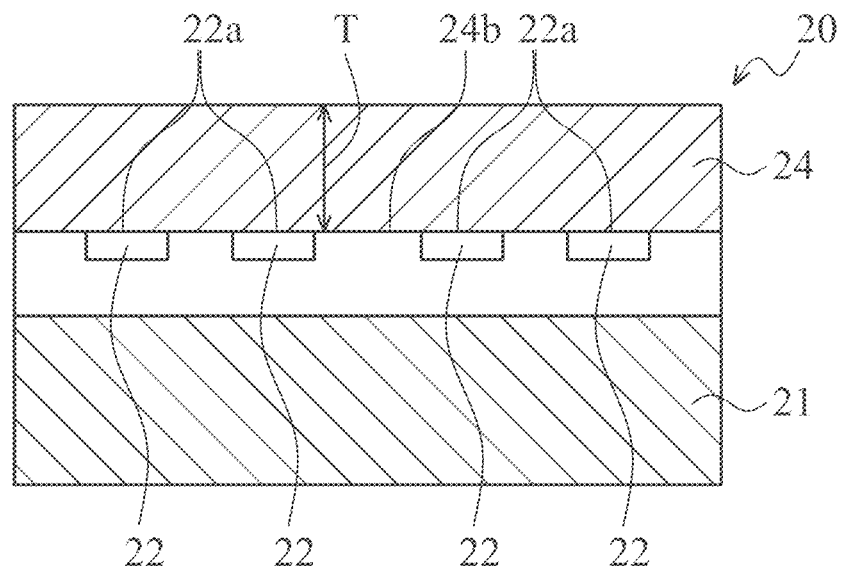
FIG. 8 through 13 are cross-sectional views of intermediate stages in the manufacturing of an embedded wafer-level package in accordance with alternative embodiments.

FIGS. 8 through 13 illustrate cross-sectional views of intermediate stages in the manufacturing of an embedded wafer-level package in accordance with alternative embodiments. Unless specified otherwise, the reference numerals in these embodiments represent like elements in the embodiments illustrated in FIGS. 1 through 7B. Referring to FIG. 8, dies 20 (with one of dies 20 illustrated) are provided. Dies 20 are similar to dies 20 in FIG. 1, except no copper pillars are formed over bond pads 22. Dielectric layer 24 thus covers bond pads 22, with bottom surface 24b of dielectric layer 24 being substantially level with top surfaces 22a of bond pads 22. Dielectric layer 24 is free from conductive features formed therein. Again, thickness T of dielectric layer 24 may be greater than about 10 μm, and may be between about 10 μm and 30 μm, or between about 10 μm and about 50 μm.

Figure 9:
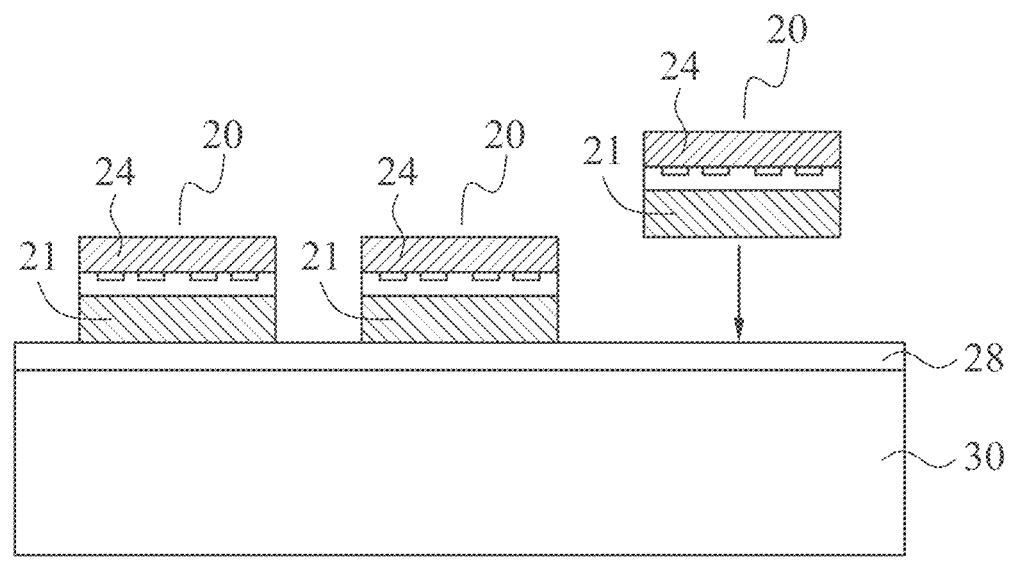
Figure 10:
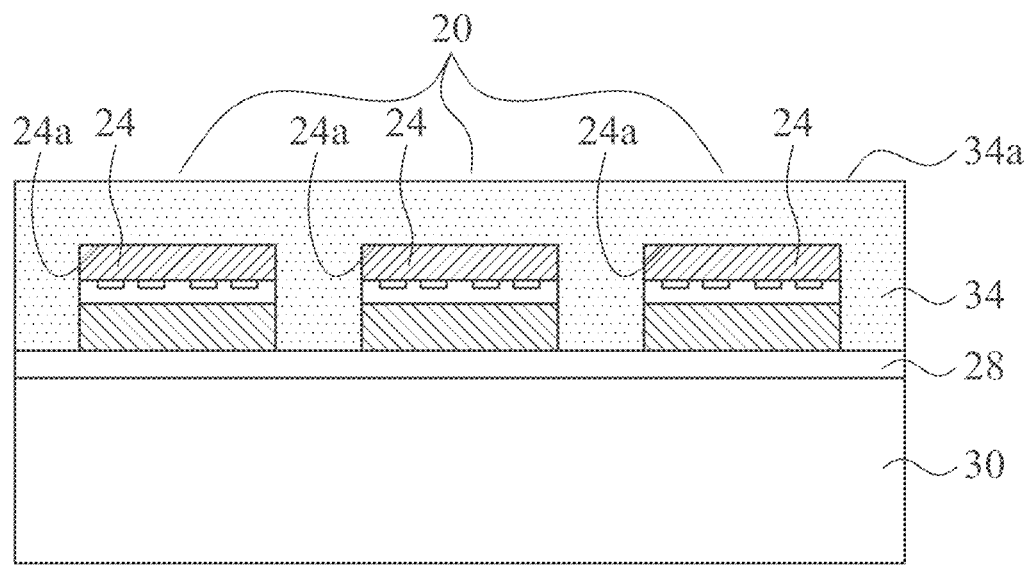
Figure 11:
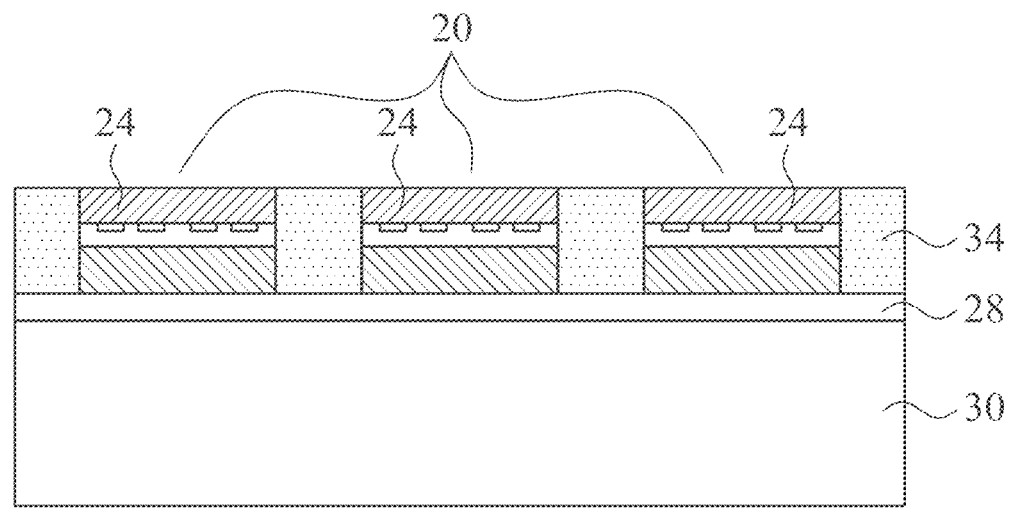

Next, as shown in FIG. 9, dies 20 are mounted on carrier 30 through adhesive layer 28, followed by the application of molding compound 34, as shown in FIG. 10. The top surface 34a of molding compound 34 is higher than top surface 24a of dielectric layer 24. Molding compound 34 is then grinded until dielectric layers 24 are exposed, and the portions of molding compound 34 directly over dies 20 are removed. The resulting structure is shown in FIG. 11.

Figure 12:
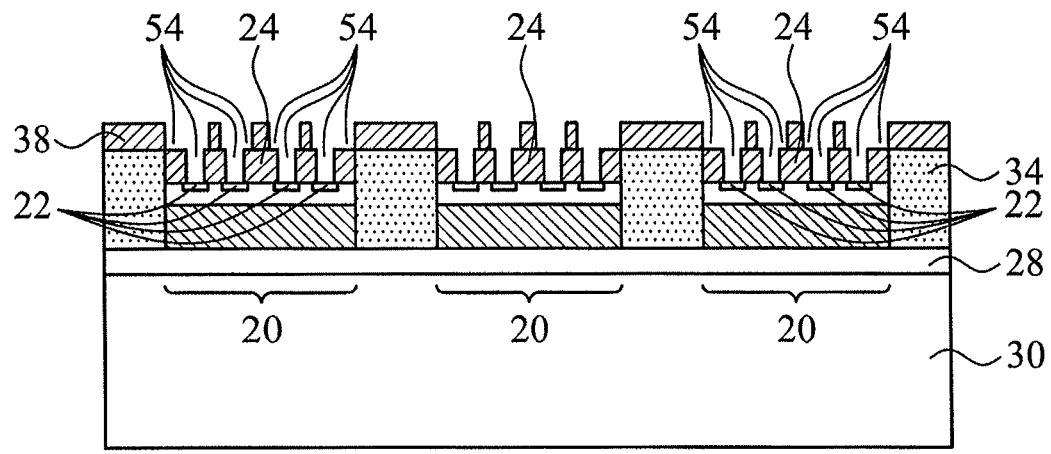
Figure 13:
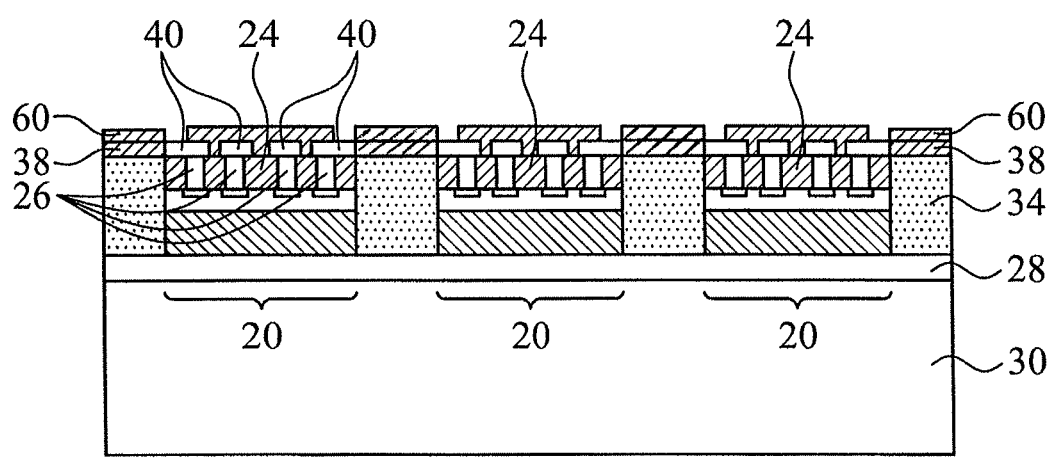

Referring to FIG. 12, openings 54 are formed in dielectric layer 24 by etching dielectric layer 24. Bond pads 22 are exposed through openings 54. In an embodiment, openings 54 are single damascene openings. In alternative embodiment, dielectric layer 38 is formed over dielectric layer 24, and openings 54 are dual damascene openings includes lower portions in dielectric layer 24 and upper portions in dielectric layer 38, with upper portions wider than lower portions. Referring to FIG. 13, openings 54 are filled with a conductive material to form conductive pillars 26, and possibly conductive traces 40 in addition to conductive pillars 26. In an embodiment, conductive pillars 26 and conductive traces 40 are formed of copper, aluminum, iron, silver, molybdenum, solder paste, or the like. A planarization such as a chemical mechanical polish (CMP) may be performed to level the top surfaces of conductive pillars 26 (or conductive traces 40, if any) to the top surfaces of dielectric layers 24 (or the top surface of dielectric layer 38). In other embodiments, a plating step is performed to fill copper into openings 54. In yet other embodiments, other methods such as physical vapor deposition (PVD) may be used, and the filling material may include a titanium layer (not shown) and a copper layer (not shown) over the titanium layer. FIG. 13 also illustrates the formation of dielectric layer 60. The remaining process steps are essentially the same as shown in FIGS. 7A and 7B, and hence are not repeated herein.

In the formation process in accordance with embodiments, carrier 30 is used to support the respective overlying package structure throughout the grinding and the formation of redistribution lines. Accordingly, the thickness of molding compound 34 may be reduced. Wafer 44 (refer to FIG. 6) may thus have smaller warpage. Molding compound 34 (FIG. 7A) is not formed on the backside of dies 20, and hence the heat dissipation of dies 20 is not degraded. Further, metal pillars 26 may also be used as alignment marks to improve the alignment accuracy.

In accordance with embodiments, a method includes providing a carrier with an adhesive layer disposed thereon; and providing a die including a first surface, a second surface opposite the first surface. The die further includes a plurality of bond pads adjacent the second surface; and a dielectric layer over the plurality of bond pads. The method further includes placing the die on the adhesive layer with the first surface facing toward the adhesive layer and dielectric layer facing away from the adhesive layer; forming a molding compound to cover the die, wherein the molding compound surrounds the die; removing a portion of the molding compound directly over the die to expose the dielectric layer; and forming a redistribution line above the molding compound and electrically coupled to one of the plurality of bond pads through the dielectric layer.

In accordance with other embodiments, a method includes providing a carrier with an adhesive layer disposed thereon; and providing a plurality of dies, with each of the plurality of dies including a substrate having a bottom; a plurality of bond pads on a side opposite the bottom; a dielectric layer over the plurality of bond pads; and a plurality of metal pillars in the dielectric layer and electrically coupled to the plurality of bond pads. The method further includes placing the plurality of dies on the adhesive layer with the bottom of the substrate of each of the plurality of dies facing the adhesive layer; filling a molding compound between the plurality of dies, wherein the molding compound covers the dielectric layer of each of the plurality of dies; performing a planarization on the molding compound until the plurality of metal pillars are exposed; and forming redistribution lines over the dielectric layer and electrically coupled to the plurality of metal pillars.

In accordance with yet other embodiments, a method includes providing a carrier with an adhesive layer disposed thereon; and providing a plurality of dies, with each of the plurality of dies including a substrate having a bottom; a plurality of bond pads on a side opposite the bottom; and a dielectric layer over the plurality of bond pads, wherein the dielectric layer is substantially free from conductive features therein. The method further includes placing the plurality of dies on the adhesive layer with the bottom of the substrate of each of the plurality of dies facing the adhesive layer; filling a molding compound between the plurality of dies, wherein the molding compound covers the dielectric layer of each of the plurality of dies; and performing a planarization on the molding compound until the dielectric layer is exposed. After the step of performing the planarization, the dielectric layer is etched to form a plurality of openings, wherein the plurality of bond pads is exposed through the plurality of openings. The openings are filled to form a plurality of conductive pillars.

In accordance with yet other embodiments, a device includes a substrate; a dielectric layer over the substrate; a plurality of metal pillars in the dielectric layer; and a molding compound contacting an edge of the substrate and an edge of the dielectric layer. The dielectric layer and the molding compound are formed of different dielectric materials.

In accordance with yet other embodiments, a device includes a semiconductor substrate; an active device at a surface of the semiconductor substrate; a dielectric layer over the semiconductor substrate; a plurality of metal pillars in the dielectric layer; and a molding compound encircling, and contacting edges of, the semiconductor substrate and the dielectric layer, with the molding compound and the dielectric layer formed of different materials. A top surface of the molding compound is substantially level with top surfaces of the metal pillars and a top surface of the dielectric layer. The device further includes redistribution lines over the dielectric layer and electrically coupled to the plurality of metal pillars.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    placing a die over a carrier, wherein the die comprises:
        a substrate;
        a plurality of bond pads over the substrate; and
        a dielectric layer over the plurality of bond pads;
    forming a molding compound surrounding the die;
    removing a portion of the molding compound overlapping the die to expose the dielectric layer, wherein the step of removing the portion of the molding compound comprises grinding;
    after removing the portion of the molding compound, etching the dielectric layer to form openings; and
    forming conductive pillars in the openings to electrically couple to the plurality of bond pads.

2. The method of claim 1 further comprising, after the step of forming the conductive pillars, forming metal bumps over and electrically coupled to the conductive pillars.

3. The method of claim 1 further comprising, after the conductive pillars are formed, demounting the carrier.

4. The method of claim 1, wherein a thickness of the dielectric layer is greater than about 10 µm.

5. The method of claim 1 further comprising sawing through the molding compound, wherein remaining portions of the molding compound and the die form an additional die.

6. The method of claim 1, wherein the step of etching the dielectric layer and forming the conductive pillars comprises a dual damascene process.

7. The method of claim 1, wherein before the step of etching the dielectric layer, the dielectric layer is free from conductive features therein.

8. A method comprising:
    providing a carrier with an adhesive layer disposed thereon;
    placing a plurality of dies over the carrier, wherein the plurality of the dies is adhered to the carrier through an adhesive layer, and wherein each of the plurality of dies comprises:
        a substrate;
        a plurality of bond pads over the substrate; and
        a dielectric layer over the plurality of bond pads, wherein a bottom of the substrate of each of the plurality of dies faces the adhesive layer;
    filling a molding compound between the plurality of dies, wherein the molding compound covers the dielectric layer of each of the plurality of dies;
    performing a planarization on the molding compound until the dielectric layer is exposed;
    etching exposed portions of the dielectric layer to form a plurality of openings, exposing the plurality of bond pads; and
    forming a plurality of conductive pillars in the plurality of openings.

9. The method of claim 8 further comprising forming redistribution lines over and electrically coupled to the plurality of conductive pillars.

10. The method of claim 9 further comprising:
    after the step of forming the redistribution lines, forming a plurality of metal bumps over and electrically coupled to the redistribution lines; and
    separating the carrier from the plurality of dies and the molding compound.

11. The method of claim 8, wherein the plurality of conductive pillars comprises copper.

12. The method of claim 8, wherein the dielectric layer has a thickness greater than about 10 µm.

13. The method of claim 8, wherein the step of etching the exposed portions of the dielectric layer and forming the plurality of conductive pillars comprises a dual damascene process.

14. A method comprising:
placing a die over a carrier, wherein the die comprises:
   a substrate; and
   a plurality of bond pads over the substrate, wherein the die is free from conductive features exposed through a top surface of the die;
applying a molding compound to cover the die;
removing dielectric materials covering the plurality of bond pads to reveal the plurality of bond pads, wherein the step of removing the dielectric materials comprises performing a grinding step to remove a portion of the molding compound overlapping the plurality of bond pads; and
forming conductive pillars to physically contact the plurality of bond pads.

15. The method of claim 14 further comprising, after the grinding step, etching a dielectric layer covering the plurality of bond pads.

16. The method of claim 15, wherein the dielectric layer comprises a material selected from the group consisting of a solder resist, polybenzoxazole (PBO), benzocyclobutene (BCB), and a molding compound.

* * * * *